United States Patent [19]

Kimura et al.

[11] 4,256,531

[45] Mar. 17, 1981

[54] PROCESS FOR PRODUCING SINGLE CRYSTAL OF YTTRIUM-IRON GARNET OR SOLID SOLUTION THEREOF

[75] Inventors: Shigeyuki Kimura; Isamu Shindo; Yasumichi Mori, all of Sakura; Kenji Kitamura, Tsuchiura; Nobuo Ii, Sakura, all of Japan

[73] Assignee: National Institute for Researches in Inorganic Materials, Ibaraki, Japan

[21] Appl. No.: 876,612

[22] Filed: Feb. 10, 1978

[30] Foreign Application Priority Data

Aug. 9, 1977 [JP] Japan ................................ 52-95416
Aug. 9, 1977 [JP] Japan ................................ 52-95417

[51] Int. Cl.³ .......................................... C30B 13/02
[52] U.S. Cl. ........................... 156/620; 156/DIG. 63
[58] Field of Search ....... 156/620, DIG. 74, DIG. 61, 156/DIG. 63

[56] References Cited

U.S. PATENT DOCUMENTS 4,040,890  8/1977  Burrus et al. ........................ 156/620

OTHER PUBLICATIONS

Jl. of Crystal Growth, vol. 41, No. 2, 12/77, Kimura et al., pp. 192-198.
Jl. of Applied Physics, Sup. to vol. 32, No. 1, 3/61, Abernethy et al.
Balbashov et al., Izvestiya Akademii Nauk SSSR Neorganicheskie Materialy, vol. 11, No. 1, pp. 108-111, Jan. '75.
Journal of Applied Physics–Gilleo et al., vol. 29, No. 3, 3/58.
Soviet Physics, Solid State (1960), pp. 1714–1715.

*Primary Examiner*—Hiram Bernstein
*Attorney, Agent, or Firm*—Oblon, Fisher, Spivak, McClelland & Maier

[57] ABSTRACT

A single crystal of yttrium-iron garnet or solid solution comprising aluminum oxide component, gallium oxide component, iron oxide and/or the other rare earth oxide component is produced by a floating zone method.

14 Claims, 1 Drawing Figure

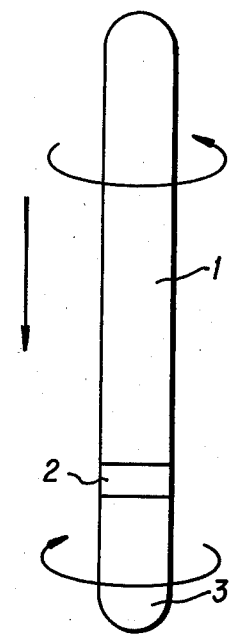

PROCESS FOR PRODUCING SINGLE CRYSTAL OF YTTRIUM-IRON GARNET OR SOLID SOLUTION THEREOF

BACKGROUND OF THE INVENTION

1. Field of the Invention

The present invention relates to a process for producing a single crystal of yttrium-iron garnet or a solid solution thereof having the formula $$R_3M_5O_{12}$$

wherein R represents Y and optionally other rare earth element and M represents Fe and optionally Al or Ga.

2. Description of the Prior Arts

The single crystals of the compound having the formula $$R_3M_5O_{12}$$

have been produced by using $PbO-PbF_2$ type flux, $BaO-BaF_2$ type flux or $Li_2MoO_4$ type flux etc. Most of single crystals of the compound having the formula $$R_3M_5O_{12}$$

have been commercially produced by said methods.

In the methods, the compound of $R_3M_5O_{12}$ has been dissolved in the flux having low melting point and the single crystal has been formed by gradually cooling it or utilizing the temperature gradient as the principle. However, the flux has been included in the single crystal as inclusion or impurity and it has taken a long time for the single crystal growth and the distribution of Fe, Al and Ga component in the yttrium-iron garnet has not been uniform and the defect ratio has been increased and the cost for the production has been disadvantageously increased. It has been known to produce it by a traveling zone method, wherein a small amount of a solvent for dissolving the components has been used and the powdery or molded components for the product of $R_3M_5O_{12}$ have been dissolved in the solvent melted by a heater (resistant heating type) and the single crystal of $R_3M_5O_{12}$ has been formed on a seed crystal at a constant speed as the principle.

However, the material of the heater has been included in the single crystal as inclusion or impurity and it has taken a long time for the single crystal growth because of no stirring.

SUMMARY OF THE INVENTION

It is an object of the present invention to provide a process for producing a single crystal of yttrium-iron garnet or a solid solution thereof without a contamination for a short time.

It is another object of the present invention to provide a process for producing a single crystal of yttrium-iron garnet or a solid solution thereof having high purity at high single crystal growth rate in low cost.

The foregoing and other objects of the present invention have been attained by producing a single crystal of an yttrium-iron garnet or a solid solution thereof having the formula $$R_3M_5O_{12}$$

by contacting a solvent with a lower edge of a rod of a mixture for the product and an upper edge of a seed crystal and heating the solvent part to melt it and forming the single crystal by a floating zone method.

BRIEF DESCRIPTION OF THE DRAWING

The drawing shows the configuration of the rod of a mixture for the product, the solvent and the seed crystal.

DETAILED DESCRIPTION OF THE PREFERRED EMBODIMENTS

In the production of the single crystal of yttrium-iron garnet, the solvent is contacted with the lower edge of the rod of the mixture for the product and the seed is contacted with the bottom of the solvent and the solvent part is heated to melt it by the floating zone method to form the single crystal of the product of $R_3M_5O_{12}$ wherein R represents Y and optionally other rare earth element and M represents Fe and optionally Al or Ga.

The rod of the mixture for the product comprises the yttrium oxide type component and the iron oxide type component at molar ratio of 2.5:5.0 to 3.5:5.0 wherein the yttrium oxide type component comprises $Y_2O_3$ as main component and optionally the other rare earth oxides as additional component, and the iron oxide type component comprises $Fe_2O_3$ as main component and optionally $Al_2O_3$ or $Ga_2O_3$ as additional component.

The solvent comprises the iron oxide type component and optionally less than 0.6 mole of the rare earth oxide component per 1 mole of the iron oxide type component.

The single crystal of the yttrium-iron garnet having the formula $$R_3M_5O_{12}$$

and having high quality means the single crystal having the width of ferromagnetic resonance absorption ($\Delta H$) of less than 2 Oe under the alternating field of 9,300 MHz as a spherical ball having a diameter of 1 mm.

The single crystal having high quality can be obtained by recrystallizing the resulting single crystal of $R_3M_5O_{12}$.

The yttrium oxide and the other rare earth oxides can be the commercially available ones without any chemical treatment and preferably have smaller diameter so as to promote the reaction with ferric oxide, aluminum oxide or gallium oxide; such as less than 1 mm especially, less than 10 $\mu m$.

The purity of yttrium oxide and the other rare earth oxide can be in special grade. When the single crystal is used as a magnetic material, the contamination of a impurity is remarkably disadvantageous whereby higher purities of the raw materials are preferable.

It is further preferable for performing the reaction to use the raw material obtained by calcining it in air at high temperature e.g. 1000° C. for a long time e.g. 1 day.

The ferric oxide used in the present invention, can be in special grade and preferably has smaller diameter so as to promote the reaction with the rare earth oxide, aluminum oxide or gallium oxide, such as less than 1 mm especially, less than 10 $\mu m$.

The aluminum oxide used in the present invention, can be in special grade and preferably has smaller diameter so as to promote the reaction with the rare earth oxide, ferric oxide or gallium oxide, such as less than 1 mm especially, less than 10 μm.

The gallium oxide used in the present invention, can be in special grade and preferably has small diameter so as to promote the reaction with the rare earth oxide, ferric oxide or aluminum oxide, such as less than 1 mm especially less than 10 μm.

In the mixing operation, it is preferable to uniformly mix the raw materials. The mixing operation can be made by various methods such as a method of mixing them with an organic liquid such as alcohols and acetone in a mortar, a method of mixing them in a mixer such as a ball mill or a method of coprecipitation after dissolving them in an acid etc.

The average diameter of powders of the mixture is preferably less than 1 mm especially less than 10 μm.

The composition for the product of $R_3M_5O_{12}$ used in the present invention is preferably a molar ratio of 2.5:5.0 to 3.5:5.0 of the rare earth oxide to the total of ferric oxide, aluminum oxide and gallium oxide. The ferric oxide is usually used as the main component for the iron oxide type component and a part can be substituted with aluminum oxide or gallium oxide (greater than 0.1 mole % especially greater than 1 mole %). The magnetic characteristics of the product can be varied by varying the content of aluminum oxide or gallium oxide. The magnetic or electric characteristics of the product may be improved by adding a small amount of the component of Ca, Sr, Ba, Sc, Ti, V, Cr, Mn, Co, Ni, Cu, Zn, Si or Ga if necessary.

The drawing illustrates the relationship of the rod for the product 1, the molten solvent 2 and the seed crystal 3. The arrows encircling the rod indicate the reverse directions of rotation of the rod 1 and seed crystal 3. The vertical arrow indicates the downward motion of the assembly.

The solvent used in the present invention is a liquid medium for dissolving the mixture for the product of $R_3M_5O_{12}$ and forming the single crystal of $R_3M_5O_{12}$ from it.

In the process of the present invention, the solvent comprises ferric oxide. The other components of aluminum oxide, gallium oxide, the rare earth oxides can be incorporated. The molar ratio of the total of ferric oxide, aluminum oxide and gallium oxide to the rare earth oxide is usually 1:0 to 1:0.6 preferably 1:0.1 to 1:0.3. The melting point of the solvent should be lower than the decomposition temperature of the product of $R_3M_5O_{12}$. When the single crystal of $Y_3Fe_5O_{12}$ is produced only ferric oxide or a mixture of small amount of yttrium oxide is used as the solvent.

The content of aluminum oxide or gallium oxide is dependent upon the composition of the solid solution of the yttrium-iron garnet.

When the molar concentrations of $Fe_2O_3$, $Al_2O_3$ and $Ga_2O_3$ in the solvent are designated as $M_{Fe_2O_3}{}^s$, $M_{Al_2O_3}{}^s$, and $M_{Ga_2O_3}{}^s$, and the molar concentrations of the components in the solid-solution are designated as $M_{Fe_2O_3}{}^c$, $M_{Al_2O_3}{}^c$ and $M_{Ga_2O_3}{}^c$, the ratio of $M_{Al_2O_3}{}^s/(M_{Fe_2O_3}{}^s+M_{Al_2O_3}{}^s+M_{Ga_2O_3}{}^s):M_{Al_2O_3}{}^c/(M_{Fe_2O_3}{}^c+M_{Al_2O_3}{}^c+M_{Ga_2O_3}{}^c)$ is preferably in a range of 1:1.5 to 1:2.5 especially 1:1.8 to 1:2.2. It is preferable to have the same relationship between $M_{Ga_2O_3}{}^s$ and $M_{Ga_2O_3}{}^c$.

In the compressing molding of the mixture, it is possible to employ a molding method using a mold for one directional compressing method or two directional compressing method. However, in order to prevent the curve of the rod in the heating step, it is preferable to employ a rubber press method wherein the pressure is hydrostatically applied.

The rubber press method means that the powdery mixture is charged in a rubber tube and both ends of the rubber tube are sealed and the rubber tube is compressed under high hydraulic pressure in a sealed hydraulic apparatus. The hydraulic pressure is usually higher than 500 Kg/cm² preferably 1 to 2 ton/cm² as economical. The hydraulic pressure is usually applied for longer than 5 seconds preferably 1 minute. The molded product prepared under lower pressure is easily cracked.

The shape of the molded mixture can be any rod type as it is used in the floating zone method. It is especially preferable to use a cylindrical rod having a diameter of 1 mm to 10 cm and a length of 1 mm to 5 m preferably a diameter of 3 mm to 1 cm and a length of 5 mm to 30 cm.

In the calcination of the molded mixture, it is possible to heat it under holding it in suitable crucible in a horizontal furnace. However, it is preferable to heat it in a vertical furnace under a suspending condition so as to prevent a contamination of impurity and not to cause curve in the calcination.

The furnace is to maintain greater than $10^{-2}$ atm. of oxygen and to be stable at the maximum temperature of 1,650° C., and preferably to maintain greater than 1 atm. of oxygen.

The temperature for calcining the molded mixture is dependent upon the kind of the rare earth oxide and the content of Al or Ga and the pressure of oxygen in the environment, and it is preferably at 1,500° to 1,750° C. in the case of the mixture for the product and at 1,400° to 1,450° C. in the case of the mixture for the solvent. It is especially preferable to be the maximum temperature {forming no liquid} in the oxygen environment in the case of the mixture for the product of $R_3M_5O_{12}$.

The time for calcining the molded mixture is preferably longer time and it is preferable to calcine the molded mixture to give a bulk density of greater than 80% of the true density.

The oxygen pressure in the environment of the calcination is preferably higher so as to prevent a formation of ferrous oxide component in the product of $R_3M_5O_{12}$ because the ferrous oxide component causes inferior magnetic characteristic. In order to prevent the incorporation of an inert gas as bubble in the calcined product, it is preferable to prevent the presence of an inert gas such as nitrogen and argon. The bubbles of the inert gas such as nitrogen and argon are moved into the solvent in the operation of the single crystal growth to form a large bubble and the bubble is broken to prevent smooth growth of the single crystal.

It is preferable to gradually heat and cool at a rate of less than 30° C. per minute at the initiation and completion of the calcination in order to prevent thermal cracking of the molded mixture.

In the process of the present invention wherein the molded mixture for $R_3M_5O_{12}$ is dissolved in the molten solvent and the single crystal of $R_3M_5O_{12}$ is formed on the seed crystal, the radiation convergence type floating zone method is employed in order to prevent a contamination of impurity and to increase the speed of the single crystal growth and to give uniform distribution of the components and to decrease the defect.

The floating zone method used in the process of the present invention means that the rod for the product is rotated and fed from the higher position into the high temperature zone maintaining the temperature to be higher than the melting point of the rod, and the seed crystal is rotated in the reverse direction and fed from the lower position and both of the rod and the seed crystal are contacted at the molten zone under the condition having no other support that is the floating zone and then, both of the rod and the seed crystal are downwardly moved at a constant speed whereby the rod is dissolved into the molten solvent and the single crystal is formed on the seed crystal from the molten solvent. The high temperature zone is maintained stably (as space and time) in the principle.

The high temperature zone maintaining the temperature being higher than the melting point of the rod in the single crystal growth apparatus for the floating zone method should be maintained at higher than 1,450° C. of the melting point of the solvent for 3 to 15 mm depending upon the diameter of the rod for $R_3M_5O_{12}$.

The length of the high temperature zone for maintaining at higher than 1,450° C. is not preferably longer or shorter than the range. The temperature distribution except near the high temperature zone is not critical.

The single crystal growth apparatus used in the process of the present invention should have an equipment for sealing the single crystal growth part from the atmosphere and varying the condition of the environment as desired.

The radiation convergence type floating zone method means the floating zone method wherein the stable high temperature zone is formed by the convergence of radiation from the light source at high temperature by a mirror or a lens.

The floating zone method of the present invention has the feature that the composition of the rod for $R_3M_5O_{12}$ is different from that of the solvent which is different from the conventional floating zone method.

That is, the molten zone is formed by adhering a small amount of the molten solvent at the lower edge of the rod for $R_3M_5O_{12}$. In the step, the molten solvent can be adhered on the top of the seed crystal or on both of the lower edge of the rod for $R_3M_5O_{12}$ and the top of the seed crystal. The amount of the molten solvent is preferably that of a semi-spherical size having the diameter of the rod for $R_3M_5O_{12}$. When the molten solvent is adhered on both of them, the amount of the molten solvent is preferably that of each semi-spherical size having the diameter of the rod or the seed crystal. The molten solvent forms the floating zone by contacting the rod for $R_3M_5O_{12}$ with the seed crystal through the molten solvent.

The seed crystal can be any kind of the solid which is resistant to high temperature and inert to the solvent and it is preferably a part of the calcined rod for $R_3M_5O_{12}$ especially the single crystal of $R_3M_5O_{12}$.

The single crystal growth speed using the rod for $R_3M_5O_{12}$, the solvent and the seed crystal in the floating zone method is equal to the speed feeding downwardly the rod and the seed crystal. The single crystal of $R_3M_5O_{12}$ is formed at a speed of greater than 0.1 mm per hour. The speed is preferably greater but it is preferably less than 10 cm per hour especially less than 8 mm per hour, optimumly in a range of 1 to 4 mm per hour. When it is too slow, the efficiency for producing the single crystal of $R_3M_5O_{12}$ is lowered and the cost is increased.

In order to prevent the formation of ferrous oxide in the resulting single crystal and to maintain the minium electrical conductivity in the grown single crystal of $R_3M_5O_{12}$, the oxygen pressure in the environment is maintained to at least $10^{-2}$ atm. The oxygen pressure is preferably higher and especially in a range of 1 to 100 atm.

When the resulting single crystal is used instead of the calcined rod for $R_3M_5O_{12}$ in the production of the single crystal of $R_3M_5O_{12}$, the single crystal is uniformly dissolved in the molten solvent whereby the recrystallization of the single crystal of $R_3M_5O_{12}$ on the seed crystal is stable and the single crystal having high quality can be obtained.

In the specification the single crystal of $R_3M_5O_{12}$ having high quality means the single crystals having a width of ferromagnetic resonance absorption of less than 5 Oe at room temperature though it is affected by the content of Al or Ga component.

In accordance with the process of the present invention, the single crystal of $R_3M_5O_{12}$ having high purity and uniform distribution of the components can be obtained in lower cost in comparison with the single crystal of $R_3M_5O_{12}$ obtained by the conventional method.

The single crystal of $R_3M_5O_{12}$ obtained by the process of the present invention can be used as a magnetic material for microwaves as the main use of ones obtained by the conventional method and also can be used in the other fields of the magnetic materials such as spinel type ferrite, etc. as it is remarkably low cost.

The present invention will be further illustrated by certain examples.

EXAMPLE 1

Single crystal growth of $Y_3Fe_{4.5}Al_{0.5}O_{12}$ $Y_2O_3$ (purity of greater than 99.9%), $Fe_2O_3$ (purity of greater than 99.9%) and $Al_2O_3$ (purity of greater than 99.9%) in powdery forms were mixed at molar ratios of 3.0:4.5:0.5 as the mixture for $Y_3Fe_{4.5}Al_{0.5}O_{12}$ and at molar ratios of 0.17:0.95:0.05 as the mixture for the solvent.

Each mixture was ground with acetone in a mortar to obtain each of two types of mixtures of fine powder having an average diameter of 1 $\mu$m.

In a thin rubber tube having a diameter of 11 mm, about 12 g of each mixture was charged and both ends of the rubber tube were sealed. The rubber tube was inserted in a mold having an inner diameter of 11.5 mm and the mixture was molded under a pressure of 1 ton/cm$^2$ for about 1 minutes in an oil pressure type hydraulic apparatus.

Each rod having a diameter of about 8 mm and a length of about 80 mm prepared by the molding step was calcined in a vertical type electric furnace at 1,550° C. for the product and at 1,400° C. for the solvent.

The cracking of the rods caused by rapid heating and quenching was prevented by taking 1 hour for inserting and discharging the rod.

The rod for the product of $Y_3Fe_{4.5}Al_{0.5}O_{12}$ having a diameter of about 6.5 mm and a length of about 60 mm was fixed on an upper rotary shaft for product of a floating zone single crystal growth apparatus employing infrared radiation convergence method. The rod for solvent having a diameter of about 7 mm and a length of about 20 mm was fixed on a lower rotary shaft for seed crystals. Oxygen (1 atom) was fed into a crystal growth chamber partitioning from the ambient by a fused quartz tube to purge air and the heating operation was initiated. Oxygen was fed at a linear speed of 0.6 cm per second near the floating zone. The edge of the rod for solvent was adjusted to the position imparting highest temperature in a single crystal growth apparatus. When the edge was melted by the heating, the temperature was kept in constant and the rod for $Y_3Fe_{4.5}Al_{0.5}O_{12}$ was downwardly shifted to be connected to the rod for solvent at the molten part. Then, the rod for solvent was cut out so as to leave suitable amount of the rod for solvent at the lower edge of the rod for $Y_3Fe_{4.5}Al_{0.5}O_{12}$. The rod for solvent was removed from the apparatus while cutting the radiation. A sintered rod of $Y_3Fe_{4.5}Al_{0.5}O_{12}$ having a diameter of 6.5 mm and a length of 20 mm as a seed crystal was fixed on the lower rotary shaft instead of the rod for solvent.

The solvent adhered at the lower edge of the rod for $Y_3Fe_{4.5}Al_{0.5}O_{12}$ was melted by heating it. The seed crystal was adjusted to contact with the solvent and was contacted with the rod for product through the molten part. The seed crystal and the rod for product were respectively rotated at a speed of 30 rpm in opposite direction each other until completing the crystal growth. The condition for imparting suitable size of the molten part was maintained by finely controlling the temperature and the gap between the rod for product and the seed crystal. Then, both of them were downwardly shifted at a constant speed of 2.0 mm/hr to form a single crystal of $Y_3Fe_{4.5}Al_{0.5}O_{12}$ on the seed crystal. Polycrystalline product was initially formed but after the growth for 10 to 15 mm, the product had a sectional view of single crystal.

When the rod for $Y_3Fe_{4.5}Al_{0.5}O_{12}$ was substantially consumed, the single crystal was cut out from the rod for product and was cooled to obtain a rod of single crystal of $Y_3Fe_{4.5}Al_{0.5}O_{12}$ having a diameter of 6 mm and a length of 40 mm.

EXAMPLE 2

Single crystal growth of $Y_3Fe_4AlO_{12}$ $Y_2O_3$ (purity of greater than 99.9%), $Fe_2O_3$ (purity of greater than 99.9%) and $Al_2O_3$ (purity of greater than 99.9%) in powdery forms were mixed at molar ratios of 3.0:4.0:1.0 as the mixture for $Y_3Fe_4AlO_{12}$ and at molar ratios of 0.17:0.9:0.1 as the mixture for solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_3Fe_4AlO_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 3

Single crystal growth of $Y_3Fe_{4.5}Al_{0.5}O_{12}$ (high quality)

The single crystal obtained by the process of Example 1 was used and recrystallized in accordance with the process of Example 1 to obtain a single crystal having a diameter of 6 mm and a length of 40 mm having high quality.

A part of the resulting single crystal was cut out and was polished to form a spherical ball having a diameter of 0.5 mm and a width of ferromagnetic resonance absorption of the ball was measured to result 1.8 Oe.

EXAMPLE 4

Single crystal growth of $Y_3Fe_{4.5}Ga_{0.5}O_{12}$ $Y_2O_3$ (purity of greater than 99.9%), $Fe_2O_3$ (purity of greater than 99.9%) and $Ga_2O_3$ (purity of greater than 99.9%) in powdery forms were mixed at molar ratios of 3.0:4.5:0.5 as the mixture for $Y_3Fe_{4.5}Ga_{0.5}O_{12}$ and at molar ratios of 0.17:0.95:0.05 as the mixture for the solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_3Fe_{4.5}Ga_{0.5}O_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 5

Single crystal growth of $Y_3Fe_4GaO_{12}$ $Y_2O_3$ (purity of greater than 99.9%), $Fe_2O_3$ (purity of greater than 99.9%) and $Ga_2O_3$ (purity of greater than 99.9%) in powdery forms were mixed at molar ratios of 3.0:4.0:1.0 as the mixture for $Y_3Fe_4GaO_{12}$ and at molar ratios of 0.17:0.9:0.1 as the mixture for the solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_3Fe_4GaO_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 6

Single crystal growth of $Y_{2.5}Nd_{0.5}Fe_5O_{12}$ $Y_2O_3$ (purity of greater than 99.9%), $Nd_2O_3$ (purity of greater than 99.9%) and $Fe_2O_3$ (purity of greater than 99.9%) in powdery forms were mixed at molar ratios of 2.5:0.5:5.0 as the mixture for $Y_{2.5}Nd_{0.5}Fe_5O_{12}$ and at molar ratios of 0.14:0.03:1.0 as the mixture for the solvent.

Each mixture was ground with acetone in a mortar to obtain each of two types of mixtures of fine powder having an average diameter of 1 μm.

In accordance with the process of Example 1, the two types of the mixture were treated to obtain a rod of single crystal of $Y_{2.5}Nd_{0.5}Fe_5O_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 7

Single crystal growth of $Y_2YbFe_5O_{12}$ $Y_2O_3$ (purity of greater than 99.9%), $Yb_2O_3$ (purity of greater than 99.9%) and $Fe_2O_3$ (purity of greater than 99.9%) in powdery forms were mixed at molar ratios of 2.0:1.0:5.0 as the mixture for $Y_2YbFe_5O_{12}$ and at molar ratios of 0.11:0.06:1.0 as the mixture for the solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_2YbFe_5O_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 8

Single crystal growth of $Y_{2.5}Gd_{0.5}Fe_4Al_{0.5}Ga_{0.5}O_{12}$ $Y_2O_3$, $GdO_3$, $Fe_2O_3$, $Al_2O_3$ and $Ga_2O_3$, which were in powdery forms and respectively had purities of greater than 99.9% were mixed at molar ratios of 2.5:0.5:4.0:0.5:0.5 as the mixture for $Y_{2.5}Gd_{0.5}Fe_4Al_{0.5}Ga_{0.5}O_{12}$ and at molar ratios of 0.14:0.03:0.9:0.05:0.05 as the mixture for the solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_{2.5}Cd_{0.5}Fe_4Al_{0.5}Ga_{0.5}O_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 9

Single crystal growth of $Y_3Fe_5O_{12}$ $Y_2O_3$ (purity of greater than 99.9%) and $Fe_2O_3$ (purity of greater than 99.9%) in powdery forms were mixed at a molar ratio of 3.1 to 5.0 as the mixture for $Y_3Fe_5O_{12}$ and at a molar ratio of 0.17 to 1.0 as the mixture for the solvent.

Each mixture was ground with acetone in a mortar to obtain each of two types of mixtures of fine powder having an average diameter of 1 μm.

In accordance with the process of Example 1, the two types of the mixtures were treated to obtain a rod of single crystal of $Y_3Fe_5O_{12}$ having a diameter of 6 mm and a length of 40 mm.

The resulting cylindrical single crystal was sliced in parallel to the growth direction and the sectional surface was polished and observed by a microscope to find no ununiform part.

EXAMPLE 10

Single crystal growth of $Y_3Fe_5O_{12}$ (high purity)

The single crystal obtained by the process of Example 9 was used as a seed crystal for a recrystallization.

A part of the resulting single crystal was cut out and was polished to form a spherical ball having a diameter of 0.5 mm and a width of ferromagnetic resonance absorption of the ball was measured to result 1.5 to 2.5 Oe.

The rods of the single crystal of $Y_3Fe_5O_{12}$ having a length of 60 mm or 20 mm obtained were respectively used as the rod for the product and the seed crystal and a part of the solvent was adhered at the edge of the rod of single crystal and the single crystal growth was repeated by the recrystallization to obtain a cylindrical rod of single crystal of $Y_3Fe_5O_{12}$ having a diameter of 5 mm and a length of 50 mm and high purity.

A width of ferromagnetic resonance absorption of the resulting single crystal (high purity) was about 0.9 Oe.

What is claimed is:

1. In a process for producing a single crystal of yttrium-iron garnet or solid solution thereof as a product by contacting a solvent with a lower edge of a calcined molded rod of a mixture of oxides for the product and with an upper edge of a seed crystal and heating the solvent part to melt it and forming a single crystal, an improvement which comprises:

using a mixture of oxides comprising yttrium oxide type component and iron oxide type component as the rod of the mixture for the product wherein a molar ratio of the yttrium oxide type component to the iron oxide type component in the rod of the mixture for the product is 2.5:5.0 to 3.5:5.0;

using a solvent comprising iron oxide type component and optionally rare earth oxide component wherein the composition of rod of the mixture for the product is different from the composition of the solvent; and forming the single crystal by a floating zone method wherein the product rod and the seed crystal are downwardly moved at a constant speed.

2. A process according to claim 1 wherein the yttrium oxide type component comprises yttrium oxide as main component and the other rare earth oxide component as additional component and the iron oxide type component comprises iron oxide as main component and at least one of aluminum oxide component and gallium oxide component as additional component in the mixture for the product.

3. A process according to claim 1 wherein the solvent comprises iron oxide type component alone.

4. A process according to claim 1 wherein the solvent comprises in addition to the iron oxide type component a rare earth oxide component present in amount less than 0.6 mole of the rare earth oxide component per 1 mole of the iron oxide type component.

5. A process according to claim 4 wherein the iron oxide type component in the solvent comprises iron oxide as main component and aluminum oxide component and/or gallium oxide component as additional component in the solvent.

6. A process according to claim 1 wherein the yttrium-iron garnet solid solution has the formula of $R_3M_5O_{12}$ wherein R represents Y and optionally the other rare earth elements; M represents Fe and optionally Al or Ga.

7. A process according to claim 1 wherein a radiation convergence type floating zone method is applied.

8. A process according to claim 1 wherein the solvent part is formed between the rod of the mixture for the product and a seed crystal.

9. A process according to claim 1 wherein the solvent part is formed by adhering the solvent on the lower edge of the rod of the mixture for the product and/or the upper edge of a seed crystal.

10. A process according to claim 1 wherein the single crystal is formed at a growth rate of greater than 0.1 mm per hour.

11. A process according to claim 1 wherein the single crystal growth is carried out in an oxygen atmosphere of greater than $10^{-2}$ atm.

12. A process according to claim 1 wherein a bulk density of the rod of the mixture for the product is greater than 80%.

13. A process according to claim 1 wherein the resulting single crystal is recrystallized by repeating the operation.

14. A process according to claim 6 wherein the ratio of the molar concentration of $Al_2O_3$ in the solvent divided by the sum of the molar concentrations in the solvent of $Fe_2O_3$, $Al_2O_3$ and $Ga_2O_3$ to the molar concentration of $Al_2O_3$ in the solid-solution product divided by the sum of the molar concentrations in the solid-solution product of $Fe_2O_3$, $Al_2O_3$ and $Ga_2O_3$ is 1:1.8 to 1:2.2 and wherein the same numerical ratio holds for $Ga_2O_3$ ratios similarly expressed; and wherein further the molar ratio of the yttrium oxide type component to the iron oxide type component in the mixture for the product is 2.5:5.0 to 3.5:5.0 and wherein yttrium oxide is the main component of the yttrium oxide type component and at least one other rare earth oxide is optionally present and also wherein iron oxide is the main component of the iron oxide type component in the mixture for the product and at least one of aluminum oxide and gallium oxide is present.

* * * * *